United States Patent
Kim et al.

(10) Patent No.: US 12,456,707 B2
(45) Date of Patent: Oct. 28, 2025

(54) STACKED CLIP DESIGN FOR GaN HALF BRIDGE IPM

(71) Applicant: Texas Instruments Incorporated, Dallas, TX (US)

(72) Inventors: Kwang-Soo Kim, Sunnyvale, CA (US); Makoto Shibuya, Tokyo (JP); Woochan Kim, San Jose, CA (US); Vivek Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 500 days.

(21) Appl. No.: 17/960,871

(22) Filed: Oct. 6, 2022

(65) Prior Publication Data
US 2024/0120308 A1     Apr. 11, 2024

(51) Int. Cl.
*H01L 23/00*     (2006.01)
*H01L 25/16*     (2023.01)

(52) U.S. Cl.
CPC .............. *H01L 24/40* (2013.01); *H01L 24/41* (2013.01); *H01L 24/48* (2013.01); *H01L 24/73* (2013.01); *H01L 24/84* (2013.01); *H01L 25/16* (2013.01); *H01L 2224/4001* (2013.01); *H01L 2224/40095* (2013.01); *H01L 2224/40225* (2013.01); *H01L 2224/4103* (2013.01); *H01L 2224/41052* (2013.01); *H01L 2224/41175* (2013.01); *H01L 2224/48157* (2013.01); *H01L 2224/73221* (2013.01); *H01L 2224/84815* (2013.01); *H01L 2924/1033* (2013.01); *H01L 2924/1426* (2013.01); *H01L 2924/19041* (2013.01); *H01L 2924/30107* (2013.01)

(58) Field of Classification Search
CPC ........................................................ H01L 24/40
USPC ......................................................... 257/773
See application file for complete search history.

(56) References Cited

U.S. PATENT DOCUMENTS

| | | | |
|---|---|---|---|
| 2009/0020887 A1* | 1/2009 | Mizuno | H01L 21/6835 257/E23.141 |
| 2014/0061884 A1* | 3/2014 | Carpenter | H01L 23/49575 257/676 |
| 2021/0296190 A1* | 9/2021 | Nakamata | H01L 23/3735 |

OTHER PUBLICATIONS

"LMG341xR070 600-V 70-mOHM Integrated GaN With Integrated Drive and Protection" data sheet, Texas Instruments SNOSD10F, Apr. 2016, revised May 2020.

(Continued)

*Primary Examiner* — Ajay Arora
(74) *Attorney, Agent, or Firm* — Ronald O. Neerings; Frank D. Cimino

(57) ABSTRACT

An electronic device includes a substrate having first and second conductive traces, a semiconductor die having a transistor with a first terminal and a second terminal, and first and second metal clips. The first metal clip has a first end portion coupled to the first terminal of the transistor, and a second end portion coupled to the first conductive trace of the substrate. The second metal clip has a first end portion coupled to the second terminal of the transistor and a second end portion coupled to the second conductive trace of the substrate, and a middle portion of the second metal clip is spaced apart from and at least partially overlying a portion of the first metal clip.

19 Claims, 15 Drawing Sheets

(56) References Cited

OTHER PUBLICATIONS

"LMG341xR050 600-V 50-mOHM Integrated GaN Fet Power Stage With Overcurrent Protection" data sheet, Texas Instruments SNOSD81B, Sep. 2018, revised Jan. 2020.
"LMG5200 80-V 10-A GaN Half-Bridge Power Stage" data sheet, Texas Instruments SNOSCY4E, Mar. 2015, revised Oct. 2018.

* cited by examiner

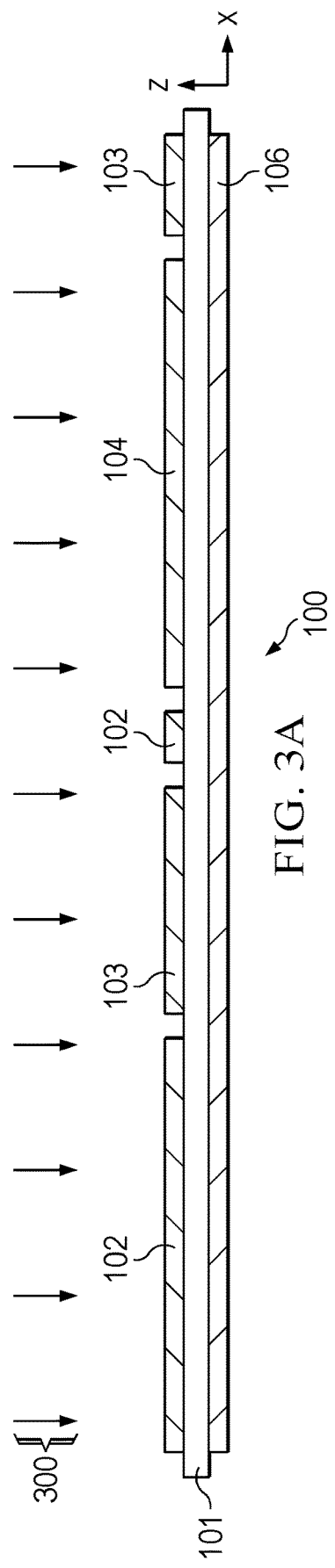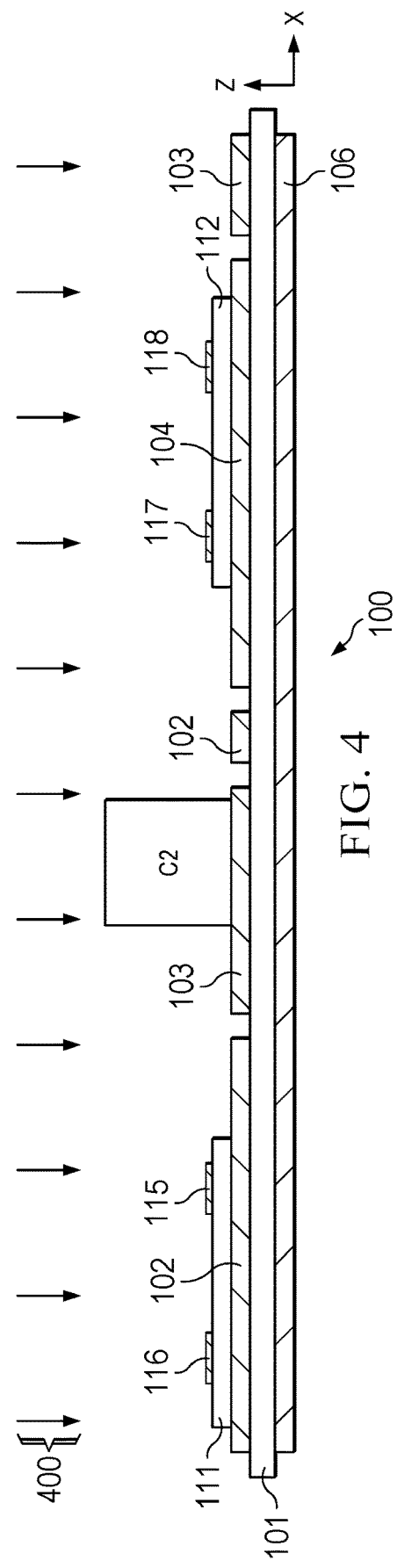

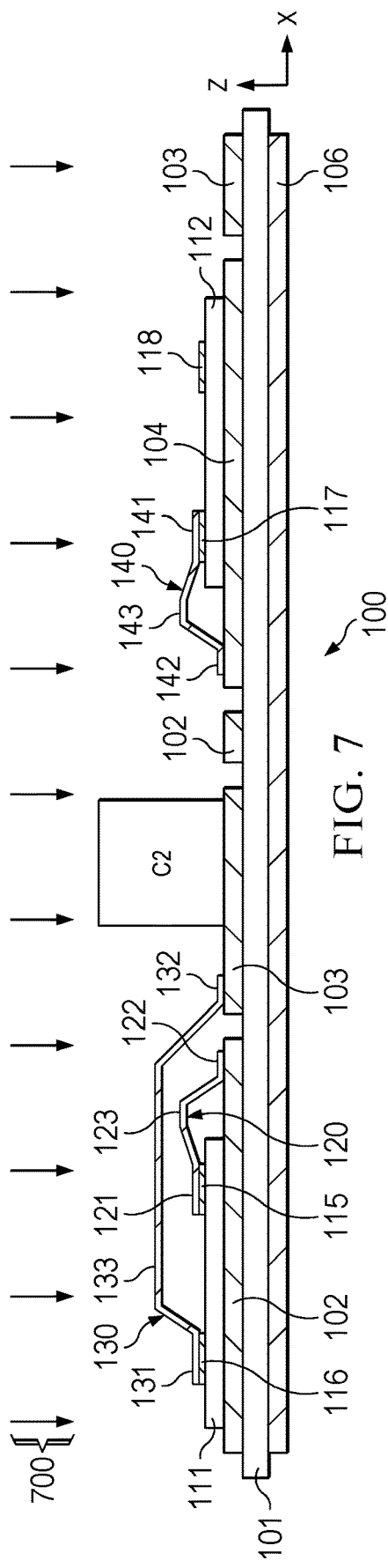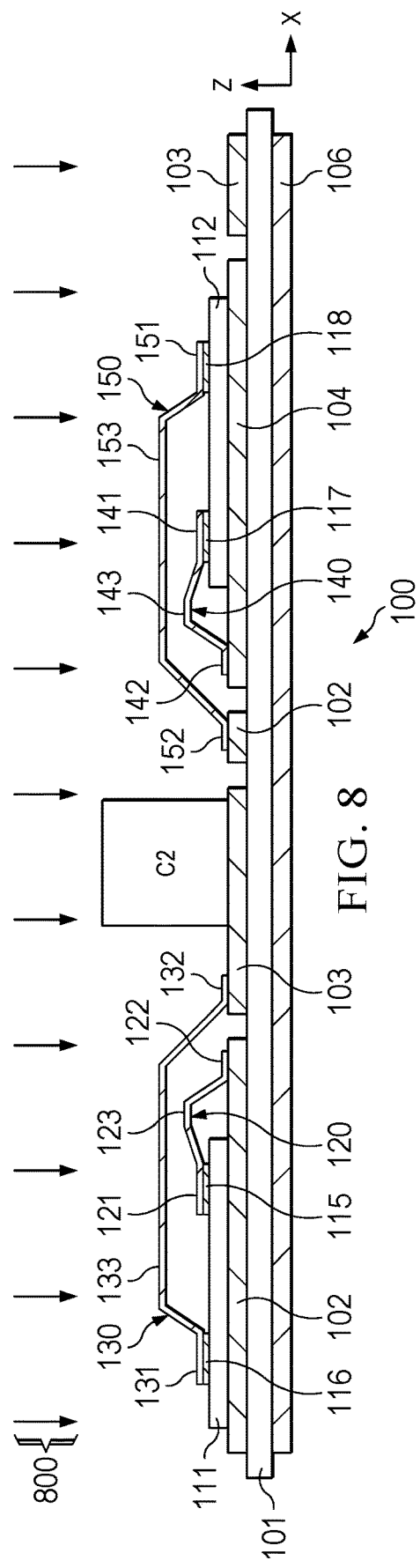

STACKED CLIP DESIGN FOR GaN HALF BRIDGE IPM

BACKGROUND

Packaged electronic devices may include multiple components and/or dies interconnected to form an electronic circuit. High power circuitry for integrated power modules (IPMs) often includes large capacitors and other passive components outside switching transistor dies, with circuit connections made by bond wires. High current connections often require wedge bonding using thick aluminum bond wires, such as transistor source and drain terminal connections of a half bridge circuit. However, heavy aluminum wedge bonding requires additional spacing between terminal connection points and tall capacitors or other adjacent components and structures due to the size of the wedge bonding tools. This limits attempts to reduce power module sizes. Alternating field effect transistor (FET) source and drain terminals can be used to accommodate wedge wire bonding tooling spacing requirements for smaller module footprints, but further size reduction is desired for compact system designs.

SUMMARY

In one aspect, an electronic device includes a substrate having first and second conductive traces, a semiconductor die having a transistor with a first terminal and a second terminal, and first and second metal clips. The first metal clip has first and second end portions and a middle portion, the first end portion of the first metal clip is coupled to the first terminal of the transistor, and the second end portion of the first metal clip is coupled to the first conductive trace of the substrate. The second metal clip has first and second end portions and a middle portion, the first end portion of the second metal clip is coupled to the second terminal of the transistor, the second end portion of the second metal clip is coupled to the second conductive trace of the substrate, and the middle portion of the second metal clip is spaced apart from and at least partially overlying a portion of the first metal clip.

In another aspect, a half-bridge circuit includes first and second transistors and metal clips. The first transistor has a first source and a first drain, and the second transistor has a second source and a second drain. A first metal clip is coupled between the first source and a switching node, a second metal clip at least partially overlies a portion of the first metal clip and is coupled between the first drain and a supply node. A third metal clip is coupled between the second source and a reference node, and a fourth metal clip at least partially overlies a portion of the third metal clip and is coupled between the second drain and the switching node.

In a further aspect, a method of fabricating an electronic device includes attaching a first end portion of a first metal clip to a first terminal of a transistor of a semiconductor die, attaching a second end portion of the first metal clip to a first conductive trace of a substrate, attaching a first end portion of a second metal clip to a second terminal of the transistor, and attaching a second end portion of the second metal clip to a second conductive trace of the substrate with a middle portion of the second metal clip spaced apart from and at least partially overlying a portion of the first metal clip.

BRIEF DESCRIPTION OF THE DRAWINGS

FIGS. 3 and 3A are top plan and partial sectional side elevation views of the electronic device undergoing a substrate attach process.

FIG. 4 is a partial sectional side elevation view of the electronic device undergoing a die and passive component attach process.

FIG. 7 is a partial sectional side elevation view of the electronic device undergoing a third clip attach process.

FIG. 8 is a partial sectional side elevation view of the electronic device undergoing a fourth clip attach process.

DETAILED DESCRIPTION

Figure 1:
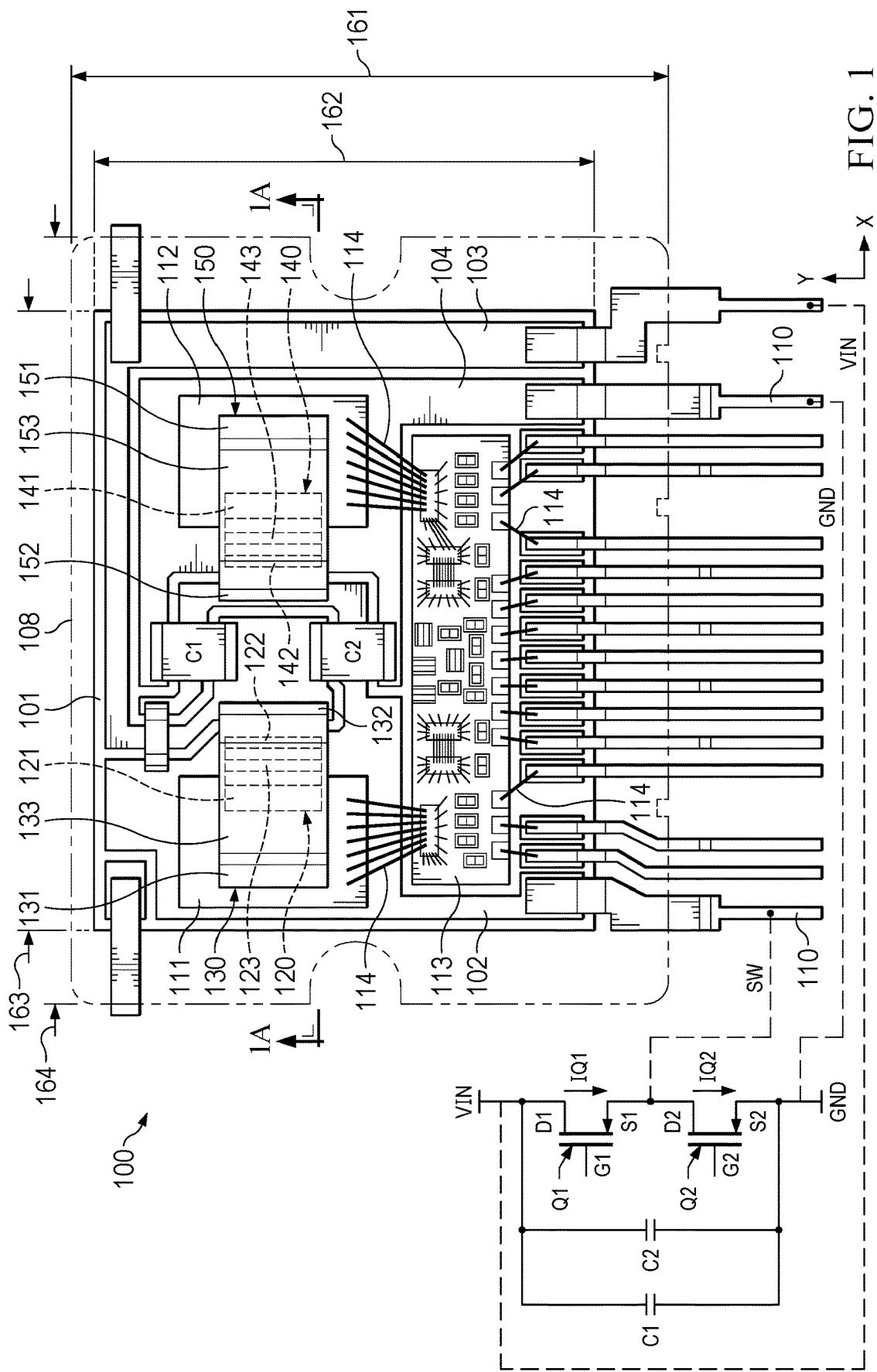
FIG. 1 is a top plan view of an electronic device with a half bridge transistor circuit having nested clips.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means+/−10 percent of the stated value.

Figure 1A:
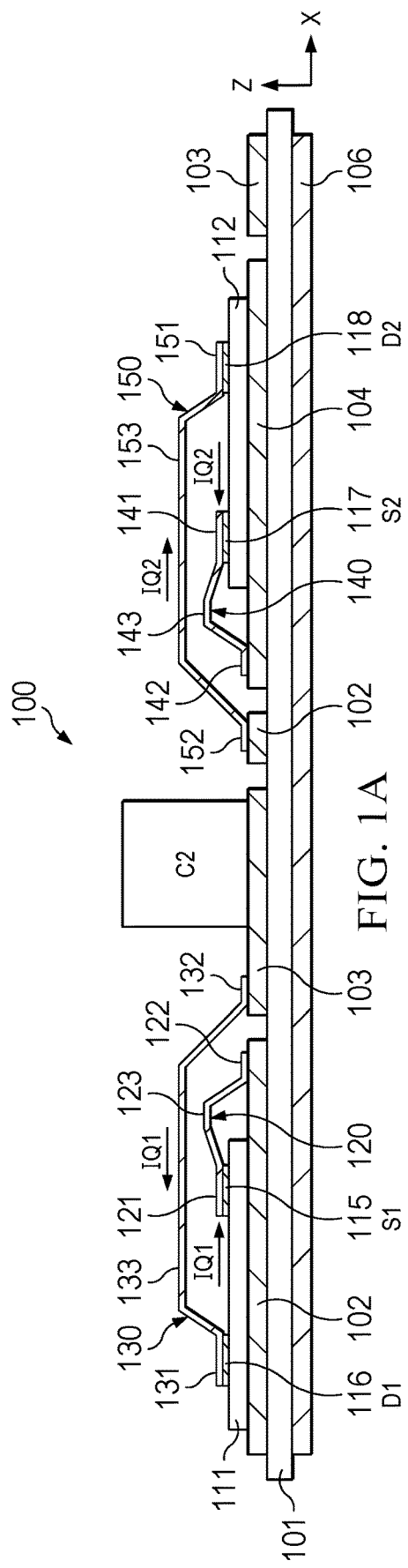
FIG. 1A is a partial sectional side elevation view of the electronic device taken along line 1A-1A in FIG. 1.
Figure 1B:
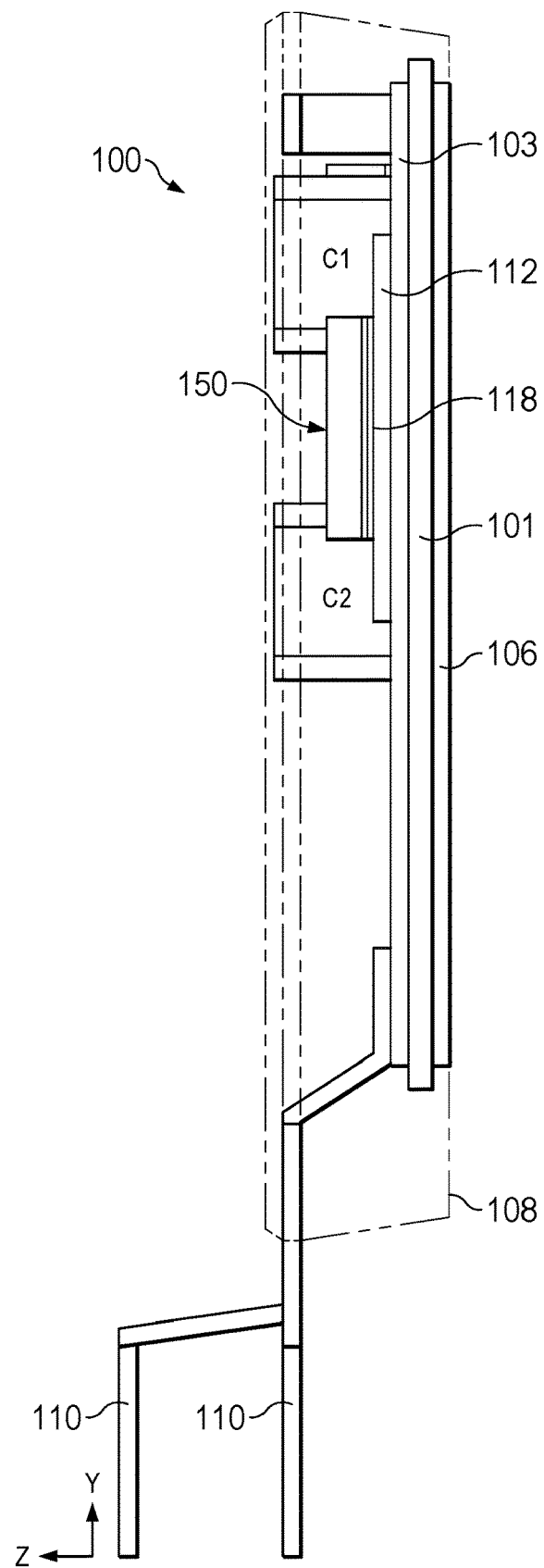
FIG. 1B is a side view of the electronic device of FIG. 1.

FIGS. 1-1B show an electronic device 100 with nested clips that provide electrical connections. FIG. 1 shows a top view of the electronic device 100, FIG. 1A shows a partial sectional side view taken along line 1A-1A of FIG. 1, and FIG. 1B shows a side view of the electronic device 100. The illustrated example uses dual clip bonds with different heights for gallium nitride transistor source and drain interconnections for the transistors of a half bridge circuit and provides an electrical connection solution with space saving advantages over wirebonding, while providing current carrying capability as good or better than wedge bonding. This facilitates device size reduction to support compact power systems or other end use applications. Moreover, certain examples enable reduced current path distances and increased cross sectional area of current paths in the electronic device, along with reduced signal or power connection inductance in the electronic device 100.

The illustrated electronic device 100 is an integrated power module (IPM) with a half bridge transistor circuit and transistor gate driver circuitry, and includes a substrate 101 having patterned first, second, and third conductive traces 102, 103, and 104 along one side of the substrate 101 to form respective switching, supply, and reference nodes SW, VIN, and GND. The electronic device 100 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. As shown in FIGS. 1A and 1B, the substrate 101 includes a conductive trace level 106 on the opposite side of the substrate 101.

A package structure 108, such as a molded or ceramic structure encloses the substrate 101 and portions of conductive leads 110. The illustrated electronic device 100 is a system in package (SIP) with two rows of through hole leads or pins 110 partially exposed outside the package structure 108 to form a dual inline package (DIP) package type that can be soldered to a host printed circuit board (PCB, not shown). Different package forms and types can be used in other examples, including without limitation dual inline packages (DIP) for through hole board mounting, as well as surface mount technology (SMT) packages with gull wing, J or other types of leads, and/or other interconnections such as no-lead packages, solder balls or bumps, conductive metal pillars and/or other conductive metal terminals for flip chip or ball grid array (BGA) type attachment to a host PCB or the like.

The illustrated electronic device 100 includes a first semiconductor die 111 mounted to the substrate 101 and a second semiconductor die 112 mounted to the substrate 101. FIG. 1 schematically illustrates certain half bridge circuit connections. The first semiconductor die 111 includes a first transistor Q1 and the second semiconductor die 112 includes a second transistor Q2. In one example, the first transistor Q1 and the second transistor Q2 are gallium nitride GaN transistors. In other examples, different transistors and types can be used, including without limitation silicon-based transistors such as FETs, bipolar transistors, IGBTs, etc. The electronic device 100 also includes a circuit board 113 with driver circuitry, and bond wires 114 that provide electrical connections between the semiconductor dies 111 and 112 and the circuit board 113, as well as bond wire connections between the circuit board 113 and the leads 110. The package structure 108 encloses the semiconductor die 111, metal clips 120, 130, 140, and 150, the circuit board 113, and the bond wires 114.

The first transistor Q1 has first and second terminals 115 and 116 (FIG. 1A), respectively. In the illustrated example, the first terminal 115 of the first transistor Q1 is a first source (e.g., labeled S1 in FIGS. 1 and 1A) and the second terminal is a first drain (e.g., labeled D1 in FIGS. 1 and 1A). The first transistor Q1 also includes a first gate terminal labeled G1 in the schematic portion of FIG. 1. As shown in FIG. 1A, the second transistor Q2 has a first terminal 117 (e.g., a second source labeled S2 in FIGS. 1 and 1A), and a second terminal 118 (e.g., a second drain labeled D2 in FIGS. 1 and 1A). In one example, the drain and source terminals 115-118 of the transistors Q1 and Q2 are coupled to conductive structures, such as copper or aluminum bond pads or pillars externally exposed on the top sides of the respective semiconductor dies 111 and 112 to allow solder or conductive adhesive electrical and mechanical connection to metal clips. The second transistor Q2 includes a second gate terminal labeled G2 in the schematic portion of FIG. 1. The electronic device 100 also includes capacitors C1 and C2 mounted to the substrate 101 and connected in parallel to one another between the respective supply and reference nodes VIN and GND.

The electronic device 100 has conductive metal clips 120, 130, 140, and 150 in nested or stacked pairs to form the drain and source connections of the transistors Q1 and Q2 in the half bridge circuit. In the illustrated circuit, the first transistor Q1 is configured as a high side transistor between the supply node VIN and the switching node SW, and the second transistor Q2 is configured as a low side transistor between the switching node SW and the reference node GND. The use of dual clip bonds with different heights provides space saving advantages compared to wedge bonding or other wirebonding approaches and provides high current carrying capability for power modules or other uses in packaged electronic devices. In one example, the clips 120, 130, 140, and 150 are or include aluminum or copper or other conductive metal. In one example, the end portions of the clips 120, 130, 140, and 150 are attached to corresponding conductive metal bond pads or terminals of the semiconductor dies 111, 112 and conductive trace features 102-104 of the substrate 101 by solder (not shown). In another implementation, the end portions of the clips 120, 130, 140, and 150 are attached to corresponding conductive metal bond pads or terminals of the semiconductor dies 111, 112 and conductive trace features 102-104 of the substrate 101 by conductive adhesive material (not shown).

A first metal clip 120 has respective first and second end portions 121 and 122 as well as a middle portion 123 that joins the first and second end portions 121 and 122. The first end portion 121 of the first metal clip 120 is coupled to the first terminal 115 (e.g., the first source S1) of the first transistor Q1, and the second end portion 122 of the first metal clip 120 is coupled to the first conductive trace 102 of the substrate 101 (e.g., the switching node SW).

The second metal clip 130 has respective first and second end portions 131 and 132 and a middle portion 133 that joins the first and second end portions 131, 132 of the second metal clip 130. The first end portion 131 of the second metal clip 130 is coupled to the second terminal 116 (e.g., the first drain D1) of the transistor Q1, and the second end portion 132 of the second metal clip 130 is coupled to the second conductive trace 103 of the substrate 101 (e.g., the supply node VIN). The first transistor gate terminal G1 in this example is coupled to driver circuitry of the first semiconductor die 111 or to driver circuitry (not shown) of the circuit board 113 by one or more of the bond wires 114 to allow controlled operation (e.g., on and off switching and/or controlled analog gate-source voltage control) of the first transistor Q1 when the electronic device 100 is powered and operating.

The middle portion 133 of the second metal clip 130 is spaced apart from and at least partially overlies a portion of the first metal clip 120. This creates a nested structure that provides compact interconnection of the respective source and drain terminals S1 and D1 of the first transistor Q1 in the half bridge circuit between the switching node SW and the supply node VIN and does not require as much lateral spacing (e.g., along the first direction X) between the first semiconductor die 111 and the capacitors C1 and C2 as would be the case for bond wire transistor connections. As shown in FIGS. 1 and 1A, the use of the clips 120 and 130 allows reduction in the die to capacitor spacing compared to wedge bond connection approaches. In the illustrated implementation, the middle portion 133 of the second metal clip 130 completely overlies the first metal clip 120.

In operation when the first transistor Q1 is turned on, a first transistor current IQ1 flows through the second clip 130 from the supply node VIN into the first drain D1 in the negative X direction (to the left in FIG. 1A) and out of the first source S1 through the first clip 120 to the switching node SW (to the right in FIG. 1A). In the illustrated example, the first transistor current IQ1 flows through the respective first and second metal clips 120 and 130 in opposite respective first and second directions (e.g., along the positive and negative first direction X in the illustrated orientation). The proximate relative positioning of the first and second clips 120 and 130 provides magnetic field coupling and at least partial magnetic field cancellation of the fields associated with the current flow IQ1 in the clips 120 and 130 to reduce the common mode inductance of the coupling of the high side first transistor Q1 in the half bridge circuit. In this regard, the high side transistor inductance is significantly lower than would be the case for bond wire coupling of the transistor, and the use of the proximate nested first and second metal clips 120 and 130 provides improved circuit performance in combination with the space saving advantages. In another example, the electronic device includes a single semiconductor die 111 with a transistor Q1 coupled in a circuit by the first and second metal clips 120 and 130.

The illustrated electronic device 100 also includes the second semiconductor die 112 with the second transistor Q2 having a first terminal 117 (e.g., shown in FIG. 1A) coupled to the second drain D2 and a second terminal 118 (FIG. 1A) coupled to the second source S2. Third and fourth clips 140 and 150 respectively provide source and drain connections of the low side second transistor Q2 in the half bridge circuit.

A third metal clip 140 has respective first and second end portions 141 and 142 as well as a middle portion 143 that joins the first and second end portions 141 and 142. The first end portion 141 of the third metal clip 140 is coupled to the first terminal 117 of the second transistor Q2 (e.g., the second source S2), and the second end portion 142 of the third metal clip 140 is coupled to the third conductive trace 104 of the substrate 101 (e.g., the reference node GND). The fourth metal clip 150 has respective first and second end portions 151 and 152 and a middle portion 153 that joins the first and second end portions 151 and 152. The first end portion 151 of the fourth metal clip 150 is coupled to the second terminal 118 (e.g., the second drain D2) of the transistor Q2. The second end portion 152 of the fourth metal clip 150 is coupled to the first conductive trace 102 of the substrate 101 (e.g., the switching node SW). The second transistor gate terminal G2 in this example is coupled to driver circuitry of the second semiconductor die 112 or to driver circuitry (not shown) of the circuit board 113 by one or more of the bond wires 114 to allow controlled operation (e.g., on and off switching and/or controlled analog gate-source voltage control) of the second transistor Q2 when the electronic device 100 is powered and operating.

The middle portion 153 of the fourth metal clip 150 is spaced apart from and at least partially overlies a portion of the third metal clip 140. This creates a nested structure that provides compact interconnection of the respective source and drain terminals S2 and D2 of the second transistor Q2 in the half bridge circuit between the reference node GND and the switching node SW and does not require as much lateral spacing between the second semiconductor die 112 and the capacitors C1 and C2. As shown in FIGS. 1 and 1A, the use of the clips 140 and 150 allows reduction in the die to capacitor spacing compared to wedge bond connection approaches. In the illustrated implementation, the middle portion 153 of the fourth metal clip 150 completely overlies the third metal clip 140.

In operation when the low side second transistor Q2 is turned on, a second transistor current IQ2 flows through the fourth clip 150 from the switching node SW into the second drain D2 in the positive X direction (to the right in FIG. 1A) and out of the second source S2 through the third metal clip 140 to the reference node GND (to the left in FIG. 1A). In the illustrated example, the second transistor current IQ2 flows through the respective third and fourth metal clips 140 and 150 in opposite respective third and fourth directions (e.g., along the negative and positive first direction X in the illustrated orientation). The proximate relative positioning of the third and fourth metal clips 140 and 150 provides magnetic field coupling and at least partial magnetic field cancellation of the fields associated with the current flow IQ2 in the clips 140 and 150 to reduce the common mode inductance of the coupling of the low side second transistor Q2 in the half bridge circuit. The low side transistor inductance is significantly lower than would be the case for bond wire coupling of the second transistor Q2, and the use of the proximate nested third and fourth metal clips 140 and 150 provides improved circuit performance in combination with the space saving advantages.

As shown in FIG. 1, the packaged electronic device 100 has a package height dimension 161 along the second direction Y of approximately 19.17 mm, and the substrate 101 has a substrate height dimension 163 of approximately 20 mm along the second direction Y. In this example, moreover, the substrate 101 has a substrate width dimension 163 along the first direction X of approximately 23.69 mm, and the packaged electronic device 100 has a package width dimension 164 of approximately 29.93 mm. An implementation using aluminum wedge bonding for the half bridge transistor interconnections has a substrate width of approximately 27.76 mm and a package width of approximately 34 mm. The example electronic device 100 in this case provides approximately 12% reduction in the device width. Moreover, the implementation using aluminum wedge bonding has a power loop inductance of 2.1 nH, whereas the example electronic device 100 has a smaller power loop inductance of approximately 1.9 nH. The disclosed examples and variations thereof can be advantageously implemented in a variety of different circuit designs, circuit and package types, and configurations to facilitate reduced circuit area, increased circuit and power density, and improved circuit performance with combined space savings and reduced inductance advantages.

Figure 2:
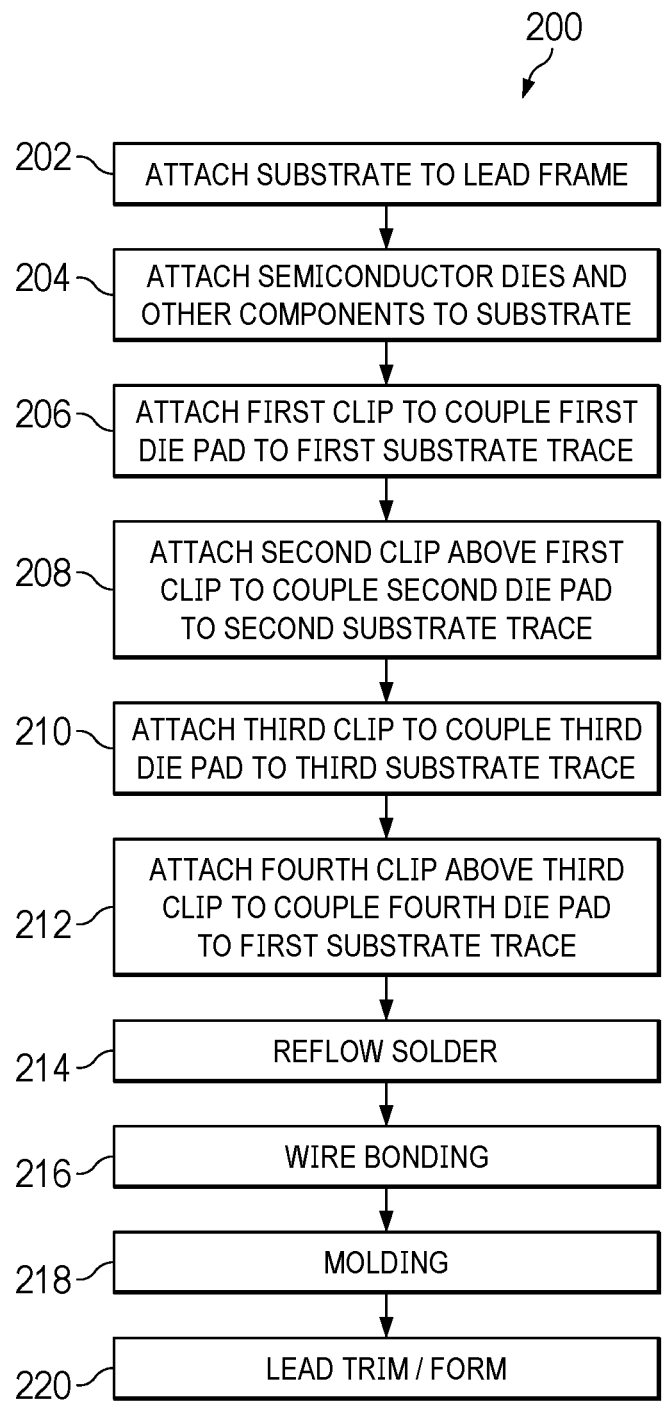
FIG. 2 is a flow diagram of a method of making an electronic device.
Figure 3:
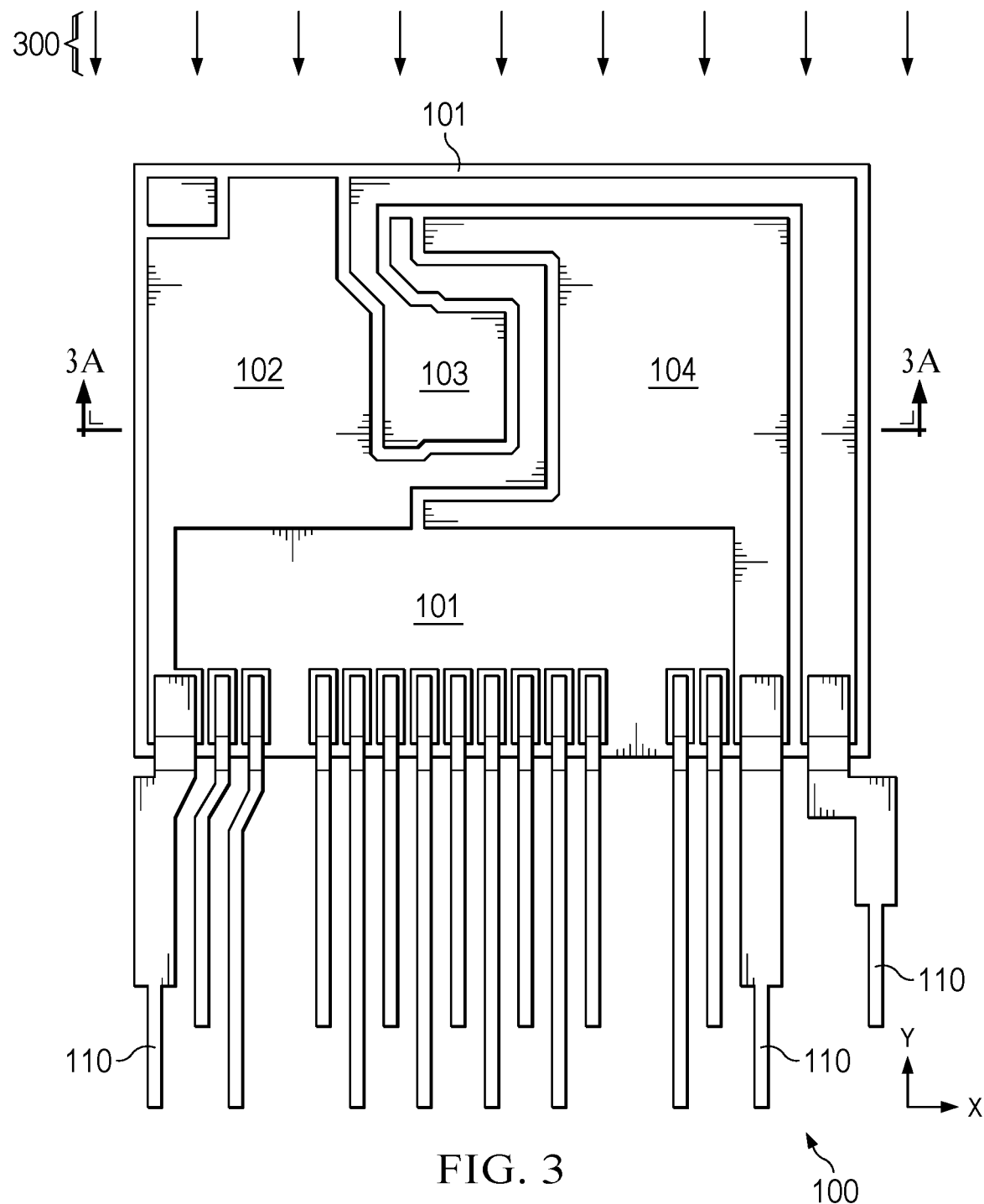

Referring also to FIGS. 2-12A, FIG. 2 shows a method 200 of making an electronic device, and FIGS. 3-12A show the above described electronic device 100 undergoing fabrication processing according to the method 200. At 202 in FIG. 2, the method 200 includes attaching a substrate to a lead frame. FIGS. 3 and 3A show one example, in which a substrate attach process 300 is performed that attaches the substrate 100 to a lead frame having the leads 110, for example, by soldering or brazing conductive features (e.g., metal traces) of the substrate 100 to respective portions of the leads 110 of the lead frame.

The method 200 continues at 204 in FIG. 2 with die and passive component attachment to the substrate. FIG. 4 shows one example, in which a die and passive component attach process 400 is performed that attaches the semiconductor die 111 and 112 and the capacitors C1 and C2 to respective metal trace features of the substrate 101 (C1 not shown in the side view of FIG. 4). In one example, the semiconductor dies 111 and 112 are attached to respective die attach pad portions of the upper trace layer of the substrate 101 using conductive or nonconductive adhesive, and the attach process 400 includes a thermal and/or UV or other adhesive curing step. In the illustrated example, the die and passive component attach processing includes applying (e.g., dispensing, silk-screening, etc.) solder paste on select portions of the conductive metal trace layer of the substrate 101, followed by automated pick and place attachment of the semiconductor dies 111, 112, the capacitors C1, C2, and the metal clips (e.g., at 206-212 in FIG. 2) onto the respective solder paste at the corresponding locations on the top side of the substrate 101, with a single thermal reflow process (e.g., 214 in FIG. 2) to reflow the solder paste and create conductive solder connections to the substrate 101. In this implementation, the semiconductor dies 111, 112, the capacitors C1, C2, and the metal clips 120, 130, 140, and 150 can be placed on the corresponding solder paste in the appropriate locations in any suitable order. In another implementation (not shown), conductive adhesive (not shown) can be provided (e.g., dispensed, silkscreened, etc.) on select portions of the patterned copper trace layer of the substrate 101, and one, some, or all of the components 111, 112, C1, C2, 120, 130, 140, and 150 and the circuit board 113 (FIG. 1) can be placed in corresponding locations, in any suitable sequence, with conductive features thereof engaging the conductive adhesive, followed by a final adhesive curing step (e.g., thermal curing, UV curing, etc.).

Figure 5:
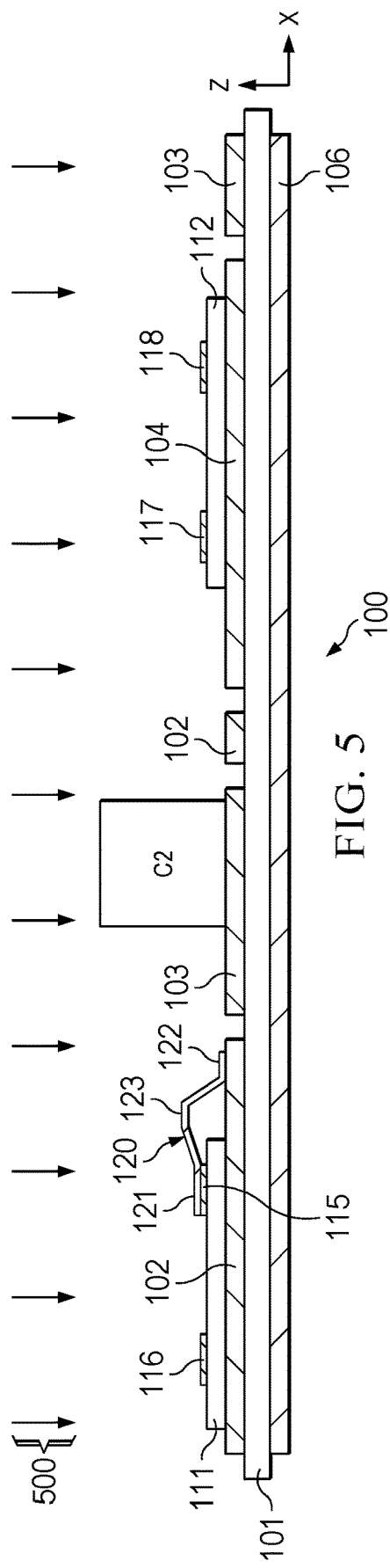
FIG. 5 is a partial sectional side elevation view of the electronic device undergoing a first clip attach process.

The example implementation continues at 206 in FIG. 2, with the attachment of the first clip 120 to couple the first die pad (e.g., the first terminal 115) of the first semiconductor die 111 to the first conductive trace 102 of the substrate 101. FIG. 5 shows one example, in which a first clip attach process 500 is performed that attaches the respective first and second end portions 121 and 122 to the solder paste on the first terminal 115 of the first transistor Q1 of the first semiconductor die 111 and the solder paste on the first conductive trace 102 of the substrate 101.

Figure 6:
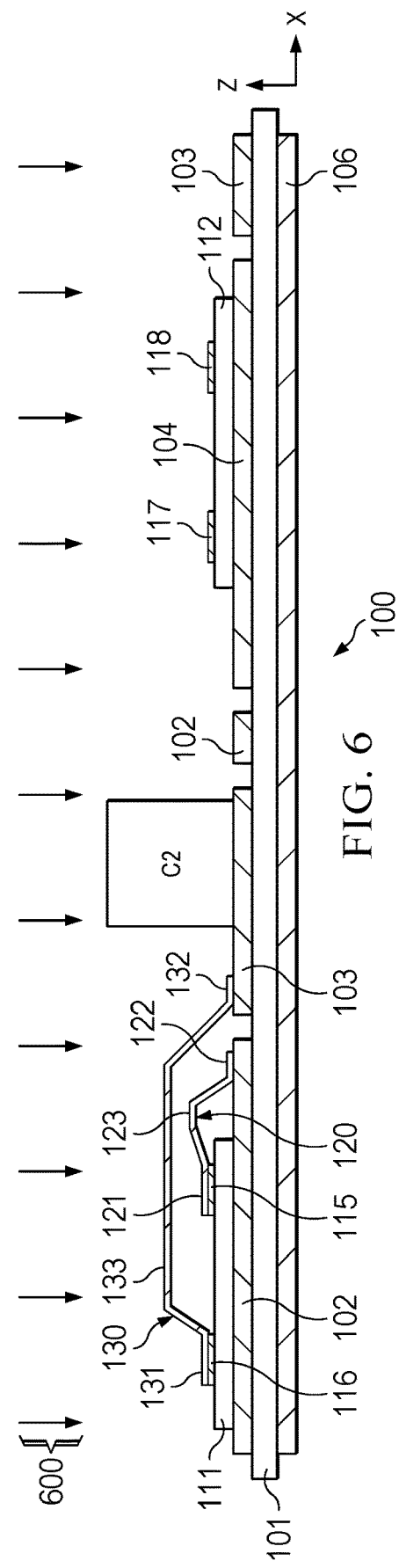
FIG. 6 is a partial sectional side elevation view of the electronic device undergoing a second clip attach process.

At 208 in FIG. 2, the method 200 continues with attaching the second clip 130 to couple the second die pad (e.g., the second terminal 116) of the first semiconductor die 111 to the second conductive trace 103 of the substrate 101. FIG. 6 shows one example, in which a second clip attach process 600 is performed that attaches the respective first and second end portions 131 and 132 of the second metal clip 130 to the solder paste on the second terminal 116 of the first transistor Q1 of the first semiconductor die 111 and the solder paste on the second conductive trace 103 of the substrate 101, with the middle portion 133 of the second metal clip 130 spaced apart from and at least partially overlying a portion of the first metal clip 120.

At 210 in FIG. 2, the method 200 continues with attaching the third clip 140 to couple a third die attach pad (e.g., the first terminal 117) of the second semiconductor die 112 to the third conductive trace 103 of the substrate 101. FIG. 7 shows one example, in which a third clip attach process 700 is performed that attaches the respective first and second end portions 141 and 142 to the solder paste on the first terminal 117 of the second transistor Q2 of the second semiconductor die 112 and the solder paste on the third conductive trace 103 of the substrate 101.

The method 200 continues at 212 in FIG. 2 with attaching the fourth clip 150 to couple a fourth die attach pad (e.g., the second terminal 118) of the second semiconductor die 112 to the first conductive trace 102 of the substrate 101. FIG. 8 shows one example, in which a fourth clip attach process 800 is performed that attaches the respective first and second end portions 151 and 152 of the fourth metal clip 150 to the solder paste on the second terminal 118 of the second transistor Q2 of the second semiconductor die 112 and the solder paste on the first conductive trace 102 of the substrate 101, with the middle portion 153 of the fourth metal clip 150 spaced apart from and at least partially overlying a portion of the third metal clip 140.

Figure 9:
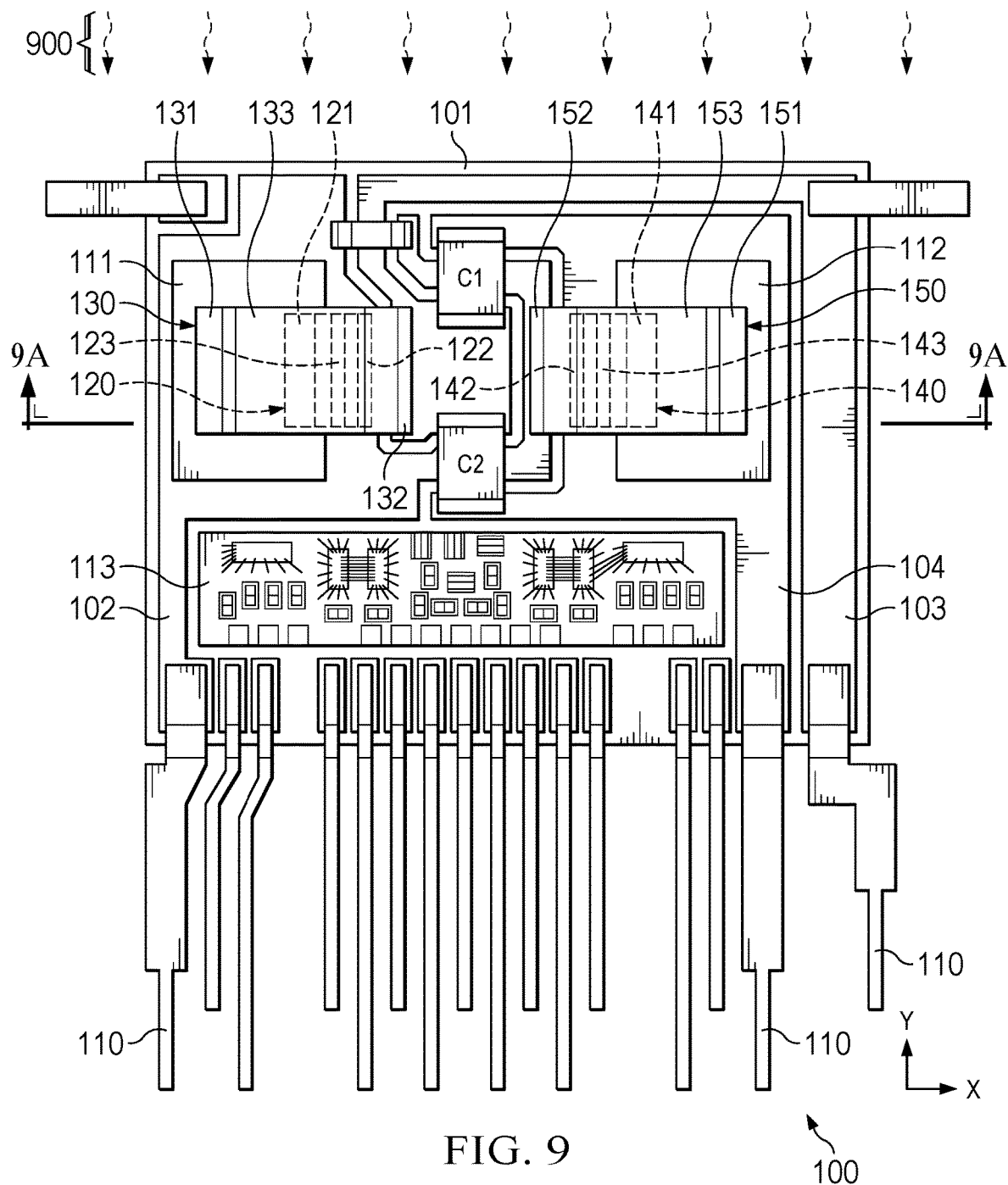
FIGS. 9 and 9A are top plan and partial sectional side elevation views of the electronic device undergoing a thermal reflow process.
Figure 9A:
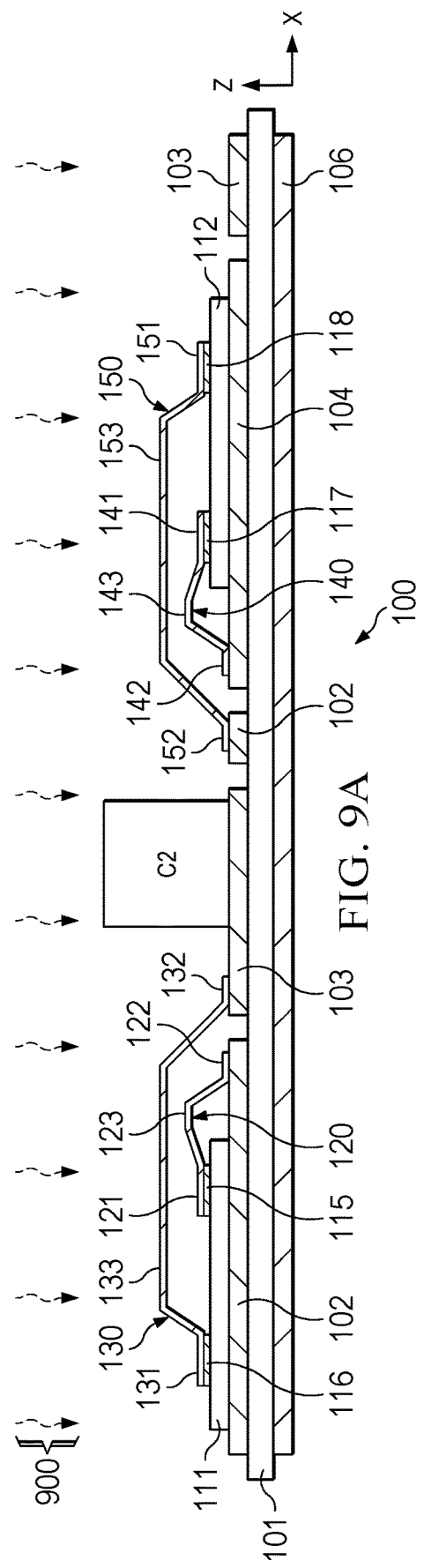

In the illustrated example, the method 200 continues at 214 with a solder reflow process. FIGS. 9 and 9A a show one example, in which a thermal curing process 900 is performed that reflows the solder paste to create structural and electrical solder connections between the respective metal features of the components 111, 112, C1, C2, 120, 130, 140, and 150 in the corresponding conductive traces 102-104 (and any dedicated die attach pad features) of the substrate 101.

Figure 10:
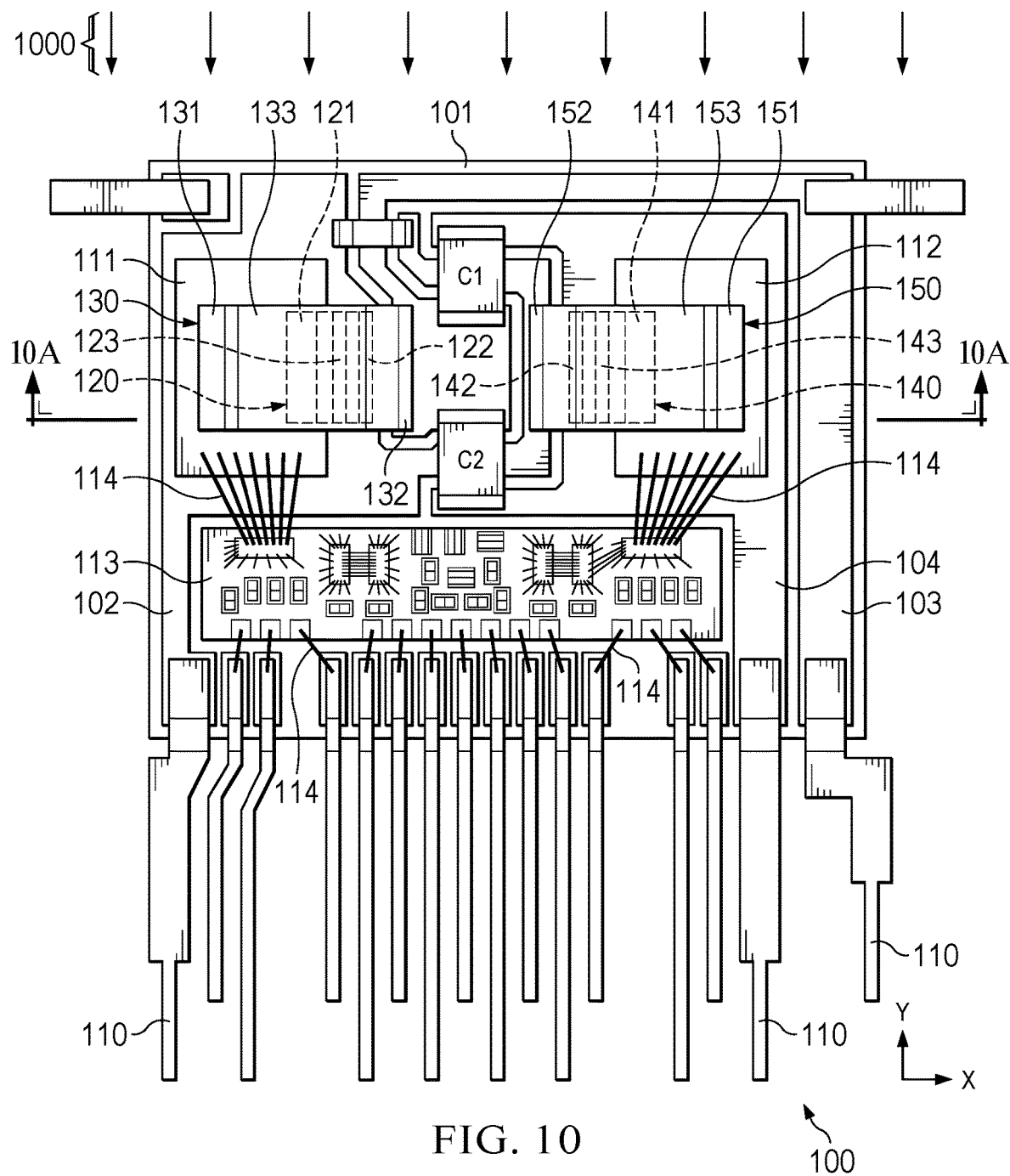
FIGS. 10 and 10A are top plan and partial sectional side elevation views of the electronic device undergoing a wire bonding electrical connection process.
Figure 10A:
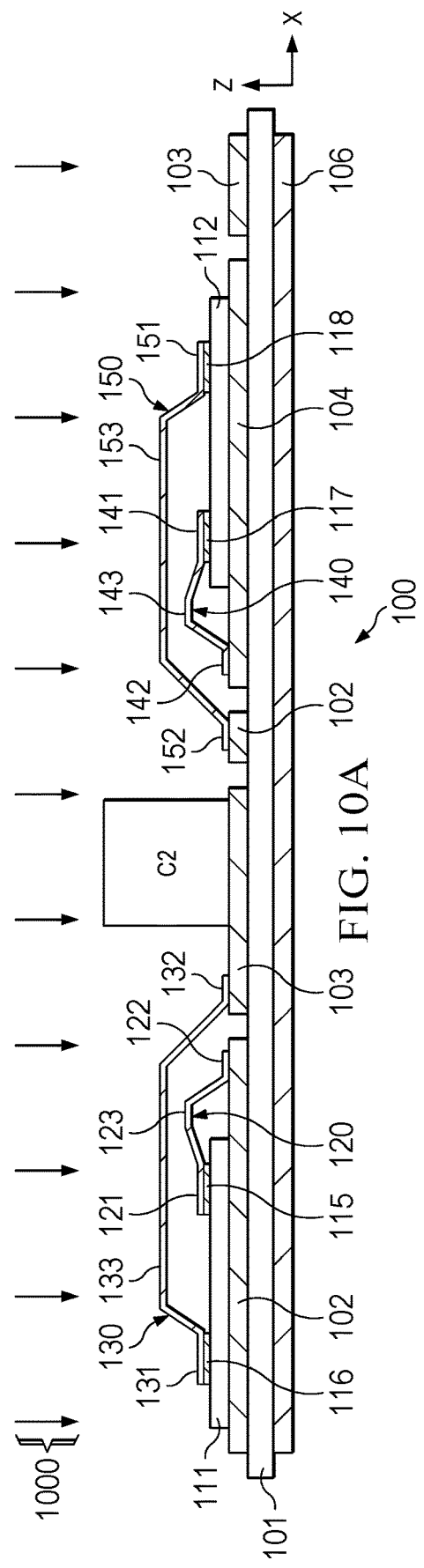

The method 200 continues at 216 in FIG. 2 with electrical connection processing. FIGS. 10 and 10A show one example, in which a wire bonding electrical connection process 1000 is performed that forms bond wires 114 to provide electrical circuit connections for the transistors Q1 and Q2 and other circuitry of the integrated power module of the electronic device 100, including bond wire connections from select conductive features (e.g., metal bond pads, not shown) of the first and second semiconductor dies 111 and 112 to conductive features (e.g., metal bond pads, not shown) of the circuit board 113, as well as further bond wire connections from further conductive features of the circuit board 113 to select ones of the conductive metal leads 110 of the lead frame.

Figure 11:
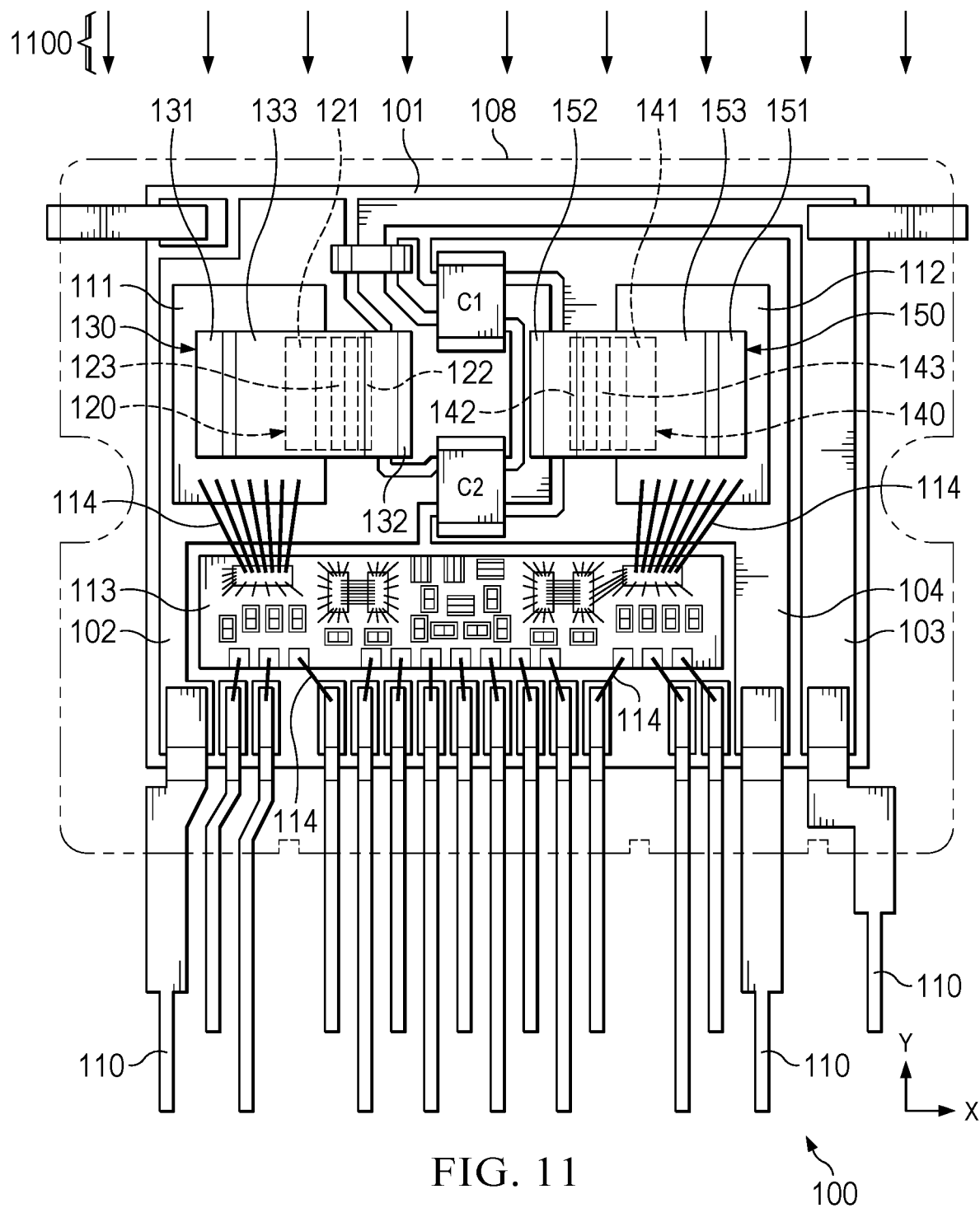
FIG. 11 is a top plan view of the electronic device undergoing a molding process.

At 218 in FIG. 2, the method 200 continues with molding. FIG. 11 shows one example, in which a molding process 1100 is performed (e.g., using injection molding equipment, not shown) that forms the molded package structure 108 that encloses the substrate 101, the semiconductor dies 111 and 112, the capacitors C1 and C2, the circuit board 113, the bond wires 114, and portions of the conductive leads 110, leaving lower portions of the conductive leads 110 exposed.

Figure 12:
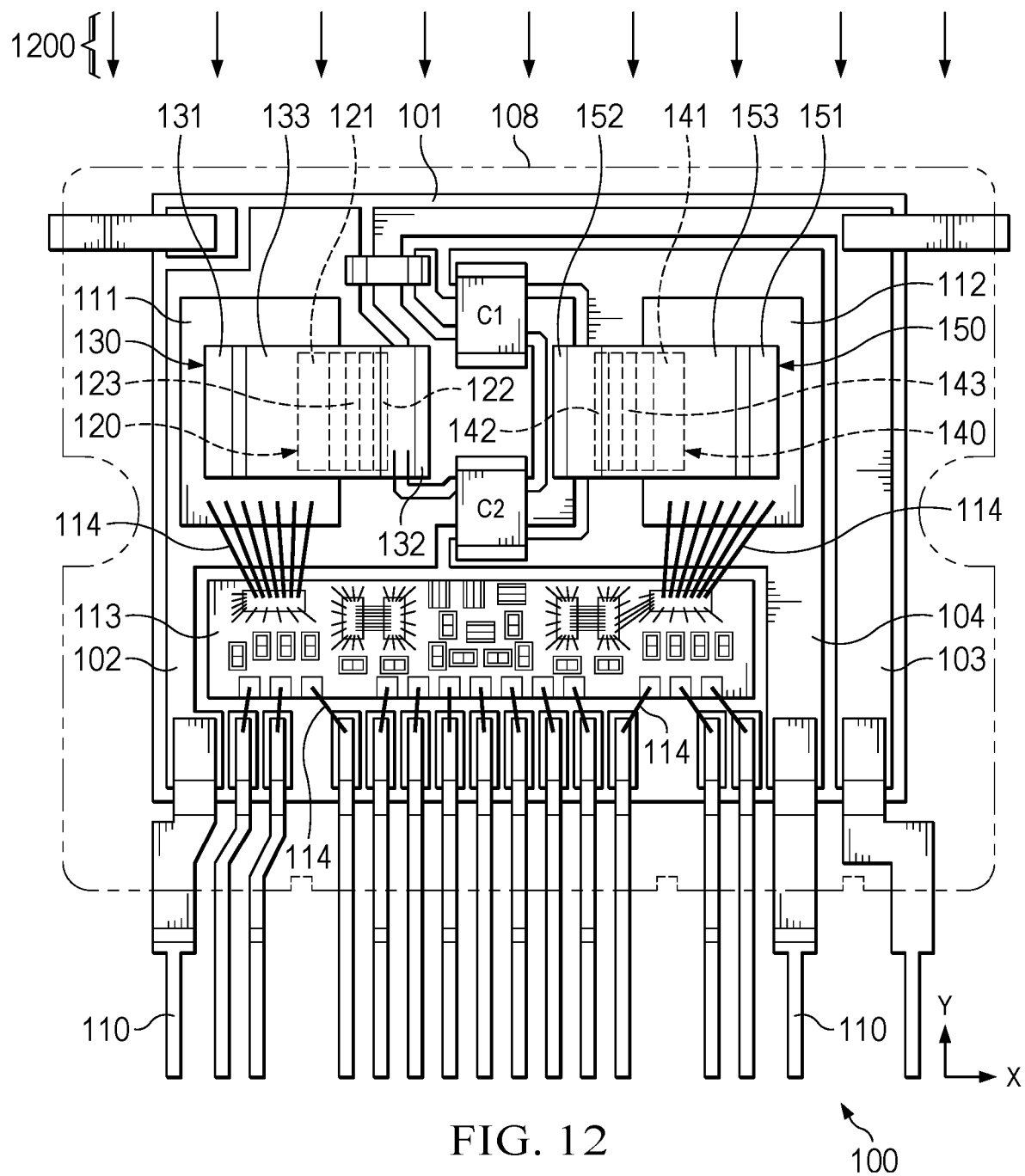
FIGS. 12 and 12A are top plan and partial sectional side elevation views of the electronic device undergoing a lead forming process.
Figure 12A:
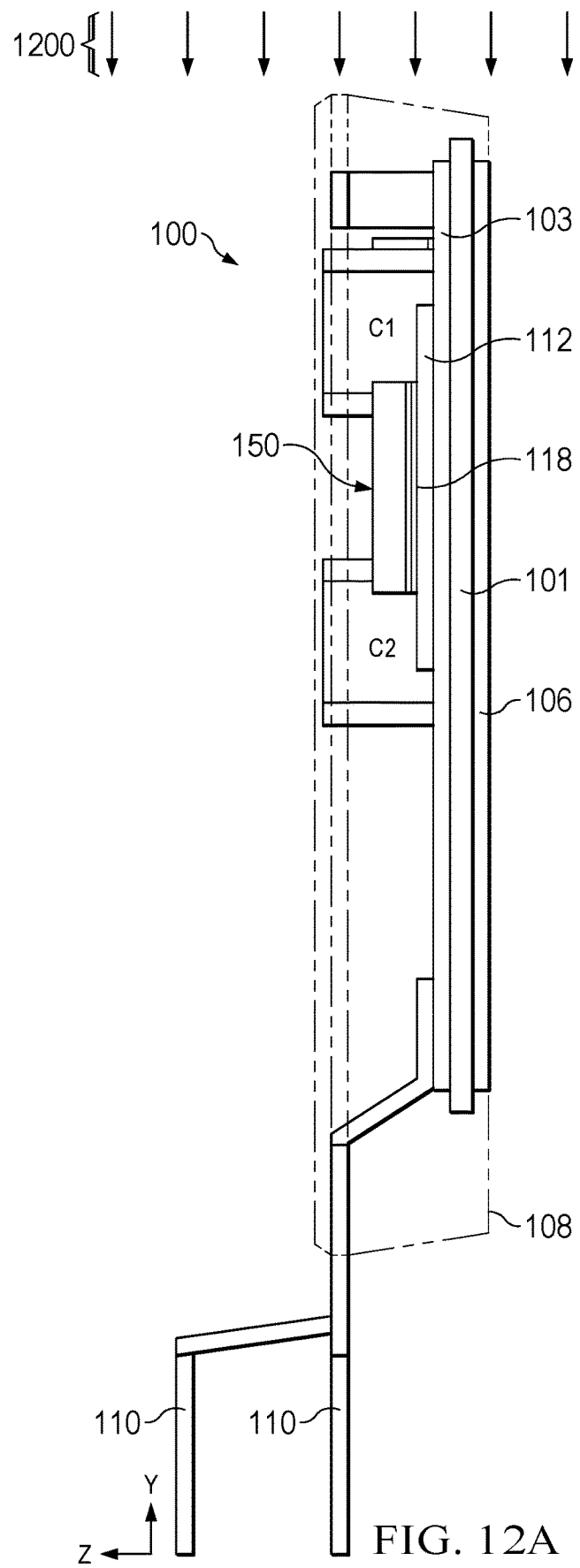

The method 200 in one example also includes lead trimming and/or forming operations at 220 in FIG. 2. FIGS. 12 and 12A show one example, in which a lead forming process 1200 is performed (e.g., using die forming equipment, not shown) that selectively bends exposed portions of some of the conductive metal leads 110 to align the leads 110 into rows to provide a dual inline package (DIP) package form to complete the electronic device 100.

Modifications are possible in the described examples, and other implementations are possible, within the scope of the claims.

What is claimed is:

1. An electronic device, comprising:
   a substrate having first and second conductive traces;
   a semiconductor die having a transistor with; a first terminal and a second terminal on a same side of the semiconductor die;
   a first metal clip having first and second end portions and a middle portion that joins the first and second end portions of the first metal clip, the first end portion of the first metal clip coupled to the first terminal of the transistor, and the second end portion of the first metal clip coupled to the first conductive trace of the substrate; and
   a second metal clip having first and second end portions and a middle portion that joins the first and second end portions of the second metal clip, the first end portion of the second metal clip coupled to the second terminal of the transistor, the second end portion of the second metal clip coupled to the second conductive trace of the substrate, and the middle portion of the second metal clip spaced apart from and at least partially overlying a portion of the first metal clip.

2. The electronic device of claim 1, further comprising:
a second semiconductor die having a second transistor with a first terminal and a second terminal;
a third metal clip having first and second end portions and a middle portion that joins the first and second end portions of the third metal clip, the first end portion of the third metal clip coupled to the first terminal of the second transistor, and the second end portion of the third metal clip coupled to a third conductive trace of the substrate; and
a fourth metal clip having first and second end portions and a middle portion that joins the first and second end portions of the fourth metal clip, the first end portion of the fourth metal clip coupled to the second terminal of the second transistor, the second end portion of the fourth metal clip coupled to the first conductive trace of the substrate, and the middle portion of the fourth metal clip spaced apart from and at least partially overlying a portion of the third metal clip.

3. The electronic device of claim 2, wherein:
a first transistor current of the transistor flows through the first and second metal clips in opposite respective first and second directions; and
a second transistor current of the second transistor flows through the third and fourth metal clips in opposite respective third and fourth directions.

4. The electronic device of claim 2, wherein:
the first terminal of the transistor is a source terminal of the transistor;
the second terminal of the transistor is a drain terminal of the transistor;
the first terminal of the second transistor is a source terminal of the second transistor; and
the second terminal second transistor is a drain terminal of the second transistor.

5. The electronic device of claim 2, wherein the transistor and the second transistor are gallium nitride transistors.

6. The electronic device of claim 2, further comprising:
a circuit board; and
bond wires connecting conductive features of the circuit board to respective conductive features of the semiconductor die.

7. The electronic device of claim 1, wherein a first transistor current of the transistor flows through the first and second metal clips in opposite respective first and second directions.

8. The electronic device of claim 2, wherein:
the first terminal of the transistor is a source terminal of the transistor; and
the second terminal of the transistor is a drain terminal of the transistor.

9. The electronic device of claim 1, wherein the transistor is a gallium nitride transistor.

10. The electronic device of claim 1, further comprising:
a circuit board; and
bond wires connecting conductive features of the circuit board to respective conductive features of the semiconductor die.

11. The electronic device of claim 10, further comprising:
a package structure that encloses the substrate, the semiconductor die, the first metal clip, the second metal clip, the circuit board, and the bond wires; and
conductive leads partially exposed outside the package structure.

12. A half-bridge circuit, comprising:
a first transistor with a first source and a first drain;
a second transistor with a second source and a second drain;
a first metal clip coupled between the first source and a switching node;
a second metal clip at least partially overlying a portion of the first metal clip and coupled between the first drain and a supply node;
a third metal clip coupled between the second source and a reference node; and
a fourth metal clip at least partially overlying a portion of the third metal clip and coupled between the second drain and the switching node.

13. The half-bridge circuit of claim 12, wherein:
the first metal clip has first and second end portions and a middle portion that joins the first and second end portions of the first metal clip, the first end portion of the first metal clip coupled to the first source, and the second end portion of the first metal clip coupled to the switching node;
the second metal clip has first and second end portions and a middle portion that joins the first and second end portions of the second metal clip, the first end portion of the second metal clip coupled to the first drain, the second end portion of the second metal clip coupled to the supply node, and the middle portion of the second metal clip spaced apart from and at least partially overlying a portion of the first metal clip;
the third metal clip has first and second end portions and a middle portion that joins the first and second end portions of the third metal clip, the first end portion of the third metal clip coupled to the second source, and the second end portion of the third metal clip coupled to the reference node; and
the fourth metal clip has first and second end portions and a middle portion that joins the first and second end portions of the fourth metal clip, the first end portion of the fourth metal clip coupled to the second drain, the second end portion of the fourth metal clip coupled to the switching node, and the middle portion of the fourth metal clip spaced apart from and at least partially overlying a portion of the third metal clip.

14. The half-bridge circuit of claim 13, comprising:
a substrate having first and second and third conductive traces that form the respective switching, supply, and reference nodes;
a first semiconductor die mounted to the substrate and including the first transistor; and
a second semiconductor die mounted to the substrate and including the second transistor.

15. The half-bridge circuit of claim 12, comprising:
a substrate having first and second and third conductive traces that form the respective switching, supply, and reference nodes;
a first semiconductor die mounted to the substrate and including the first transistor; and
a second semiconductor die mounted to the substrate and including the second transistor.

16. A method of fabricating an electronic device, the method comprising:
attaching a first end portion of a first metal clip to a first terminal of a transistor of a semiconductor die;
attaching a second end portion of the first metal clip to a first conductive trace of a substrate;

attaching a first end portion of; a second metal clip to a second terminal of the transistor, the first and second terminals on a same side of the semiconductor die; and attaching a second end portion of the second metal clip to a second conductive trace of the substrate with a middle portion of the second metal clip spaced apart from and at least partially overlying a portion of the first metal clip.

17. The method of claim 16, further comprising:

attaching a first end portion of a third metal clip to a first terminal of a second transistor of a second semiconductor die;

attaching a second end portion of the third metal clip to a third conductive trace of the substrate;

attaching a first end portion of a fourth metal clip to a second terminal of the second transistor; and attaching a second end portion of the fourth metal clip to the first conductive trace of the substrate with a middle portion of the fourth metal clip spaced apart from and at least partially overlying a portion of the third metal clip.

18. The method of claim 17, wherein attaching the end portions of the metal clips includes:

providing solder to the respective transistor terminals and conductive traces;

positioning the end portions of the metal clips on the solder; and reflowing the solder.

19. The method of claim 16, wherein attaching the end portions of the metal clips includes:

providing solder to the respective transistor terminals and conductive traces;

positioning the end portions of the metal clips on the solder; and reflowing the solder.

* * * * *